United States Patent
Lee

(10) Patent No.: US 11,449,422 B2
(45) Date of Patent: Sep. 20, 2022

(54) MEMORY CONTROLLER AND OPERATING METHOD THEREOF

(71) Applicant: SK hynix Inc., Gyeonggi-do (KR)

(72) Inventor: Seok Jun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 57 days.

(21) Appl. No.: 16/944,944

(22) Filed: Jul. 31, 2020

(65) Prior Publication Data
US 2021/0248075 A1 Aug. 12, 2021

(30) Foreign Application Priority Data
Feb. 11, 2020 (KR) .................. 10-2020-0016606

(51) Int. Cl.
*G06F 12/0804* (2016.01)
*G11C 16/04* (2006.01)

(52) U.S. Cl.
CPC .... *G06F 12/0804* (2013.01); *G06F 2212/608* (2013.01); *G11C 16/0483* (2013.01)

(58) Field of Classification Search
CPC .......... G06F 12/0804; G06F 2212/608; G11C 16/0483
See application file for complete search history.

(56) References Cited

U.S. PATENT DOCUMENTS

| | | | | |
|---|---|---|---|---|
| 10,552,058 B1* | 2/2020 | Jadon | .................. | G06F 11/1068 |
| 2006/0015683 A1* | 1/2006 | Ashmore | ............ | G06F 11/1441 |
| | | | | 711/113 |
| 2007/0033341 A1* | 2/2007 | Hashimoto | ......... | G06F 12/0871 |
| | | | | 711/113 |
| 2007/0033433 A1* | 2/2007 | Pecone | ................... | G06F 1/305 |
| | | | | 714/6.13 |
| 2007/0263455 A1* | 11/2007 | Cornwell | ............ | G11C 11/5628 |
| | | | | 365/185.28 |
| 2011/0185211 A1* | 7/2011 | Chiasson | .................. | G06F 1/30 |
| | | | | 714/48 |
| 2012/0054520 A1* | 3/2012 | Ben-Tsion | ................ | G06F 1/30 |
| | | | | 713/322 |
| 2013/0191601 A1* | 7/2013 | Peterson | ............. | G06F 12/0868 |
| | | | | 711/137 |
| 2013/0238851 A1* | 9/2013 | Chang | ................. | G06F 12/0895 |
| | | | | 711/113 |
| 2014/0265978 A1* | 9/2014 | Oakley | ................... | H02P 29/60 |
| | | | | 318/473 |
| 2014/0337562 A1* | 11/2014 | Long | ................... | G06F 12/0804 |
| | | | | 711/103 |
| 2015/0106557 A1* | 4/2015 | Yu | ....................... | G11C 11/5678 |
| | | | | 711/103 |

(Continued)

*Primary Examiner* — Prasith Thammavong
(74) *Attorney, Agent, or Firm* — IP & T Group LLP

(57) ABSTRACT

There are provided a memory controller for managing meta data and an operating method of the memory controller. The memory controller includes: a buffer memory for storing meta data used to control an operation of a memory device; and a central processing unit for updating the meta data stored in the buffer memory whenever the operation of the memory device is controlled. The central processing unit may transmit the meta data stored in the buffer memory to a host at a first frequency, and transmit the meta data stored in the buffer memory to the memory device at a second frequency lower than the first frequency.

18 Claims, 13 Drawing Sheets

(56) References Cited

U.S. PATENT DOCUMENTS

| | | | |
|---|---|---|---|
| 2015/0234607 A1* | 8/2015 | Umeda | G06F 11/1441 |
| | | | 711/103 |
| 2016/0197986 A1* | 7/2016 | Chambliss | H04L 67/2861 |
| | | | 709/213 |
| 2017/0075593 A1* | 3/2017 | Kim | G06F 3/0616 |
| 2017/0075812 A1* | 3/2017 | Wu | G06F 12/0246 |
| 2018/0032439 A1* | 2/2018 | Jenne | G06F 12/0891 |
| 2019/0012094 A1* | 1/2019 | Li | G06F 12/10 |
| 2019/0121540 A1 | 4/2019 | Shin et al. | |
| 2020/0285299 A1* | 9/2020 | Kubota | G06F 1/30 |
| 2021/0089225 A1* | 3/2021 | Boyd | G06F 3/0656 |
| 2021/0200670 A1* | 7/2021 | Winterfeld | G06F 12/0246 |
| 2021/0349828 A1* | 11/2021 | Cassuto | G06F 3/0653 |

\* cited by examiner

MEMORY CONTROLLER AND OPERATING METHOD THEREOF

CROSS-REFERENCE TO RELATED APPLICATION

The present application claims priority under 35 U.S.C. § 119(a) to Korean patent application number 10-2020-0016606, filed on Feb. 11, 2020, which is incorporated herein by reference in its entirety.

BACKGROUND

1. Field of Invention

The present disclosure generally relates to a memory controller and an operating method thereof, and more particularly, to a memory controller for managing meta data and an operating method of the memory controller.

2. Description of Related Art

A memory system may include a memory device and a memory controller.

The memory controller may control an operation of the memory system according to a request of a host. The memory device may store data or output stored data under the control of the memory controller. For example, the memory device may be configured as a volatile memory device in which stored data is lost when the supply of power is interrupted, or be configured as a non-volatile memory device in which stored data is retained even when the supply of power is interrupted.

SUMMARY

Embodiments provide a memory controller capable of improving the reliability of a memory system, and an operating method of the memory controller.

In accordance with an aspect of the present disclosure, there is provided a memory controller including: a buffer memory configured to store meta data used to control an operation of a memory device; and a central processing unit configured to update the meta data stored in the buffer memory whenever the operation of the memory device is controlled, transmit the meta data stored in the buffer memory to a host at a first frequency, and transmit the meta data stored in the buffer memory to the memory device at a second frequency lower than the first frequency.

In accordance with another aspect of the present disclosure, there is provided a method for operating a memory controller, the method including: updating meta data stored in a buffer memory whenever an operation of a memory device is controlled; transmitting the meta data stored in the buffer memory to a host at a first frequency; and transmitting the meta data stored in the buffer memory to the memory device at a second frequency lower than the first frequency.

In accordance with another aspect of the present disclosure, there is provided an operating method of a controller for controlling a memory device in response to a request from a host, the operating method comprising: updating first map data stored in the controller as a result of an operation of the memory device; requesting, upon satisfaction of a first condition, the host to update second map data stored therein based on the first map data; controlling, upon satisfaction of a second condition, the memory device to update third map data stored therein based on the first map data; and controlling the memory device to operate according to a latest of the second map data and the third map data, as the first map data.

BRIEF DESCRIPTION OF THE DRAWINGS

Various embodiments are described more fully hereinafter with reference to the accompanying drawings; however, features and aspects of the present invention may be configured or arranged in different ways. Thus, the present invention is not limited to the embodiments set forth herein. Rather, these embodiments are provided so that this disclosure is thorough and complete, and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural and functional description provided herein is directed to embodiments of the present disclosure. However, the present invention can be implemented in other ways and thus is not limited to the embodiments set forth herein. Also, throughout the specification, reference to "an embodiment" or the like is not necessarily to only one embodiment, and different references to any such phrase are not necessarily to the same embodiment(s).

Figure 1:
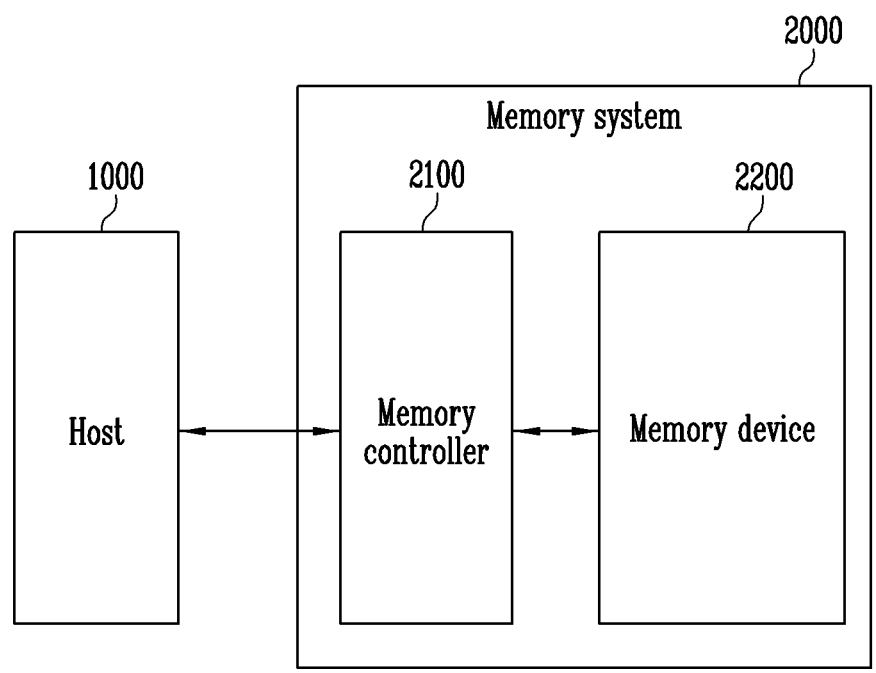
FIG. 1 is a block diagram illustrating an exemplary memory system.

FIG. 1 is a block diagram illustrating a memory system.

The memory system 2000 may include at least one memory device 2200 configured to store data and a memory controller 2100 configured to control the memory device(s) 2200 according to a request of a host 1000.

The host 1000 may be a device or system which stores data or retrieves data from the memory system 2000. For example, the host 1000 may include at least one of a computer, a portable digital device, a tablet, a digital camera, a digital audio player, a television, a wireless communication device, and a cellular phone, but embodiments of the present disclosure are not limited thereto.

The memory controller 2100 may control overall operation of the memory system 2000. The memory controller 2100 may perform various operations according to a request of the host 1000. For example, the memory controller 2100 may perform a program operation, a read operation, an erase operation, and the like on the memory device 2200.

The memory device 2200 may perform a program operation, a read operation, an erase operation, and the like under the control of the memory controller 2100.

The memory device 2200 may include a non-volatile memory. The non-volatile memory may include a plurality of storage areas. Each of the storage areas may correspond to a page including a plurality of memory cells, a memory block including a plurality of pages, a plane including a plurality of memory blocks, or a die including a plurality of planes, but the embodiments of the present disclosure are not limited thereto.

Figure 2:
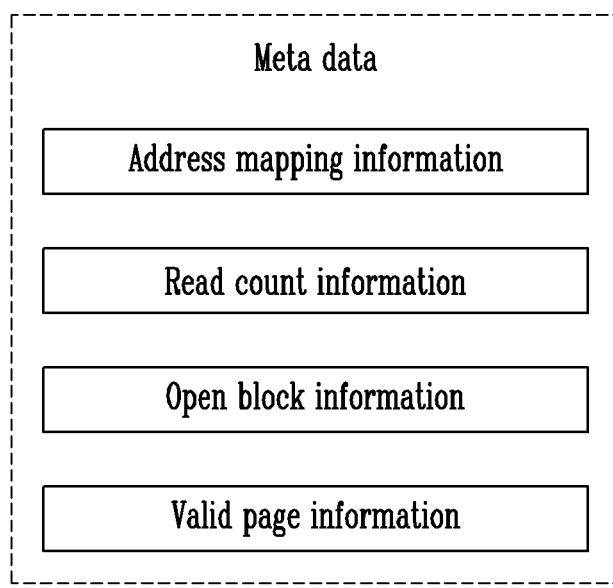
FIG. 2 is a diagram illustrating meta data in accordance with an embodiment of the present disclosure.

FIG. 2 is a diagram illustrating meta data in accordance with an embodiment of the present disclosure.

The memory controller 2100 may manage meta data to control an operation of the memory device 2200. The term "managing meta data" may mean generating or updating meta data. That is, the memory controller 2100 may generate or update meta data to control an operation of the memory device 2200.

The meta data may include various type of data used to control an operation of the memory controller 2200. For example, the meta data may include address mapping information, read count information, open block information, and/or valid page information, but the embodiments of the present disclosure are not limited thereto.

The address mapping information may include a mapping relationship between a logical address managed by the host 1000 and a physical address managed by the memory controller 2100, and the valid page information may include information indicating a page in which valid data is stored or a number of pages in which valid data is stored.

When a logical address is received together with a program request from the host 1000, the address mapping information and/or the valid page information may be updated.

For example, when no physical address is mapped to the logical address received together with the program request from the host 1000, any physical address among physical addresses corresponding to storage areas in the memory device 2200 may be mapped to the logical address received from the host 1000. Accordingly, the address mapping information may be updated.

For example, when a physical address is mapped to the logical address together with the program request from the host 1000, data stored in a storage area corresponding to the mapped physical address may be processed as invalid data. In addition, a new physical address may be mapped to the received logical address. Accordingly, the valid page information and the address mapping information may be updated. The valid page information may be referenced in a garbage collection operation of moving valid data scattered in several memory blocks to one memory block.

The read count information may include read count numbers representing a number of times a read operation has been performed on respective storage areas included in the memory device 2200.

For example, when a logical address is received together with a read request from the host 1000, the address mapping information may be referenced to check a physical address mapped to the logical address received from the host 1000. In addition, a read count number corresponding to that physical address may be increased by, for example, 1. The read count information may be referenced in a wear leveling operation.

The open block information may include information indicating a memory block designated as an open block among memory blocks included in the memory device 2200.

For example, at least one free memory block among memory blocks in the memory device 2200 may be designated as an open block. A free block may be a memory block in which no data is programmed. A program operation may be performed on the open memory block. When data is fully stored in the open memory block, a new open block may be designated, and the open block information may be updated whenever a new open block is designated. The open block information may be referenced to map a physical address to a logical address.

Figure 3:
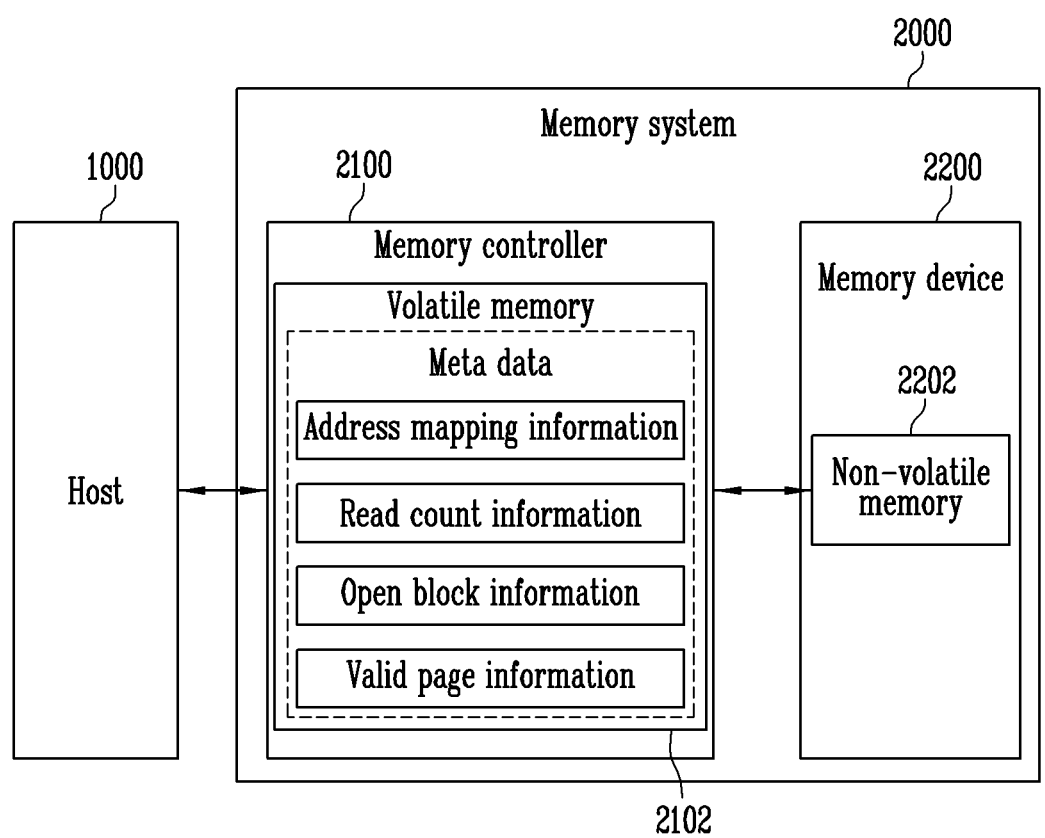
FIG. 3 is a diagram illustrating an example in which meta data is backed up.

FIG. 3 is a diagram illustrating an example in which meta data is backed up.

The memory controller 2100 may manage meta data on a volatile memory 2102. That is, the memory controller 2100 may generate meta data and store the meta data in the volatile memory 2102. Also, the memory controller 2100 may update meta data and store the updated meta data in the volatile memory 2102. When the supply of power to the memory controller 2100 is suspended, e.g., when sudden power-off (SPO) occurs, meta data stored in the volatile memory 2102 may be lost.

In order to prevent loss of meta data, the memory controller 2100 may back up the meta data to the memory device 2200. For example, the memory controller 2100 may transmit meta data stored in the volatile memory 2102 to the memory device 2200 at various times, e.g., periodically. The meta data transmitted to the memory device 2200 may be stored in a non-volatile memory 2202 in the memory device 2200.

During power-on, following a power-off, e.g., an SPO, the memory controller 2100 may receive meta data stored in the non-volatile memory 2202 from the memory device 2200, and load the received meta data to the volatile memory 2102. The memory controller 2100 may control an operation of the memory device 2200, based on the meta data loaded to the volatile memory 2102.

In order to improve the reliability of the memory system, the memory controller 2100 may transmit meta data to the memory device 2200 more frequently. However, doing so, increases write amplification of the memory device 2200, which in turn, reduces the remaining life of the memory system 2000.

In order to prolong the remaining life of the memory system 2000, the memory controller 2100 may transmit meta data to the memory device 2200 less frequently. However, with less frequent transfers, there is a higher risk that meta data may be lost in sudden power-off, and that a larger amount of meta data would be lost in such occurrence. Therefore, the reliability of the memory system 2000 may be deteriorated.

Figure 4:
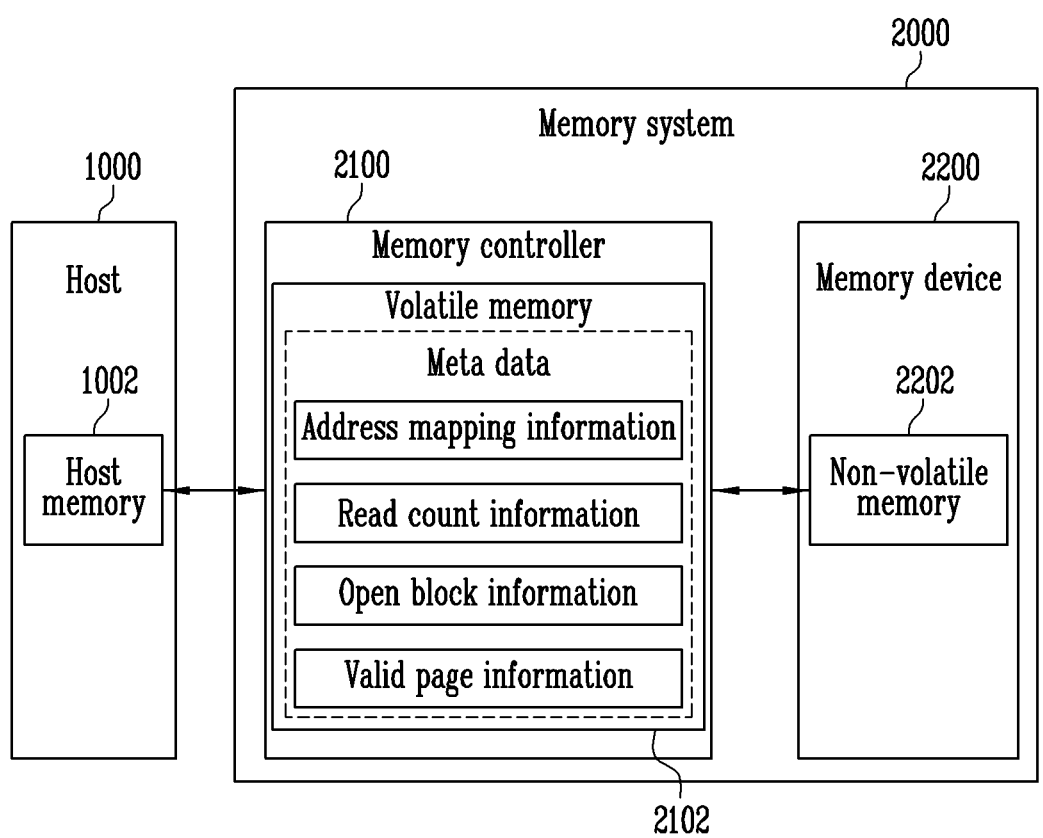
FIG. 4 is a diagram illustrating an example in which meta data is backed up in accordance with an embodiment of the present disclosure.

FIG. 4 is a diagram illustrating an example in which meta data is backed up in accordance with an embodiment of the present disclosure.

In order to prevent loss of meta data, the memory controller 2100 may back up the meta data to the host 1000 and the memory device 2200.

The memory controller 2100 may control a frequency at which meta data is backed up to the host 1000 and the memory device 2200 such that the reliability of the memory system 2000 can be improved while not unduly increasing write amplification of the memory device 2200. For example, the memory controller 2100 may back up meta data to the host 1000 more frequently than meta data is backed up to the memory device 2200.

The memory controller 2100 may transmit meta data stored in the volatile memory 2102 to the host 1000 at a first frequency. For example, whenever user data of a first size is transmitted by the host 1000 and/or stored in the memory device 2200, the memory controller 2100 may transmit meta data stored in the volatile memory 2102 to the host 1000. The meta data transmitted to the host 1000 may be stored in a host memory 1002 in the host 1000. The host memory 1002 may be a volatile memory, but the embodiments of the present disclosure are not limited thereto.

The memory controller 2100 may transmit meta data stored in the volatile memory 2102 to the memory device 2200 at a second frequency. For example, whenever user data of a second size is transmitted by the host 1000 and/or stored the memory device 2200, the memory controller 2100 may transmit meta data stored in the volatile memory 2102 to the memory device 2200. The meta data transmitted to the memory device 2200 may be stored in the non-volatile memory 2202 in the memory device 2200. The second frequency may be lower than the first frequency, and the second size may be greater than the first size.

During power-on after power-off, the memory controller 2100 may receive meta data stored in the non-volatile memory 2202 from the memory device 2200, and receive meta data stored in the host memory 1002 from the host 1000. The memory controller 2100 may load, to the volatile memory 2102, the latest version of the meta data received from the memory device 2200 and the meta data received from the host 1000. The memory controller 2100 may control an operation of the memory device 2200, based on the meta data loaded to the volatile memory 2102.

Figure 5:
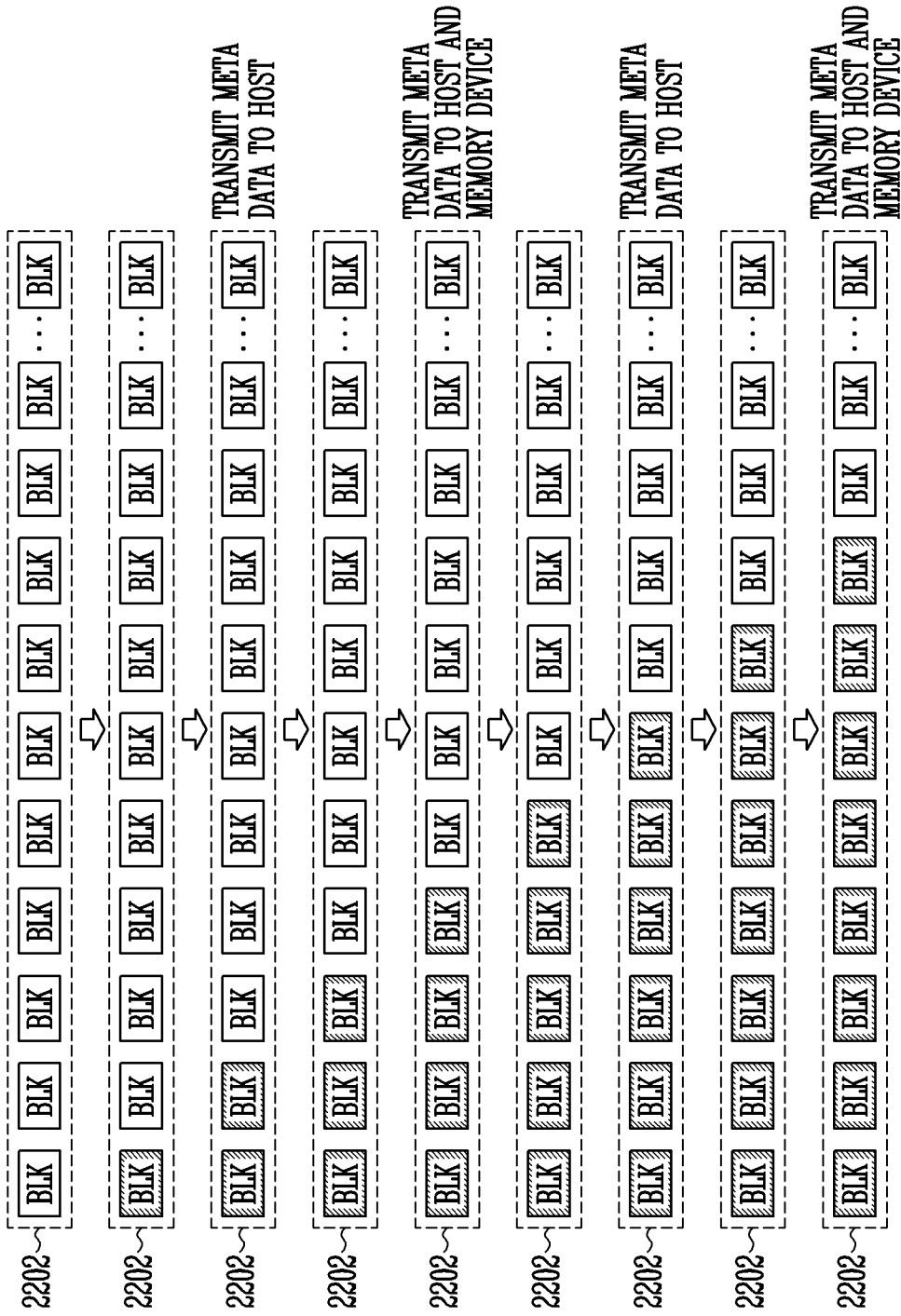
FIG. 5 is a diagram illustrating a frequency at which meta data is backed up in accordance with an embodiment of the present disclosure.

FIG. 5 is a diagram illustrating a frequency at which meta data is backed up in accordance with an embodiment of the present disclosure.

As described above, the memory controller 2100 may transmit meta data being managed thereby to the host 1000 at the first frequency, and transmit meta data being managed thereby to the memory device 2200 at the second frequency.

For example, whenever user data provided from the host 1000 to the memory device 2200 is of the first size, the memory controller 2100 may transmit meta data being managed thereby to the host 1000. Whenever user data provided from the host 1000 to the memory device 2200 is of the second size, the memory controller 2100 may transmit meta data being managed thereby to the memory device 2200.

In the embodiment described with reference to FIG. 5, it is assumed that the first size is corresponds to the data storage capacity of two memory blocks among a plurality of memory blocks BLK in the non-volatile memory 2202, and the second size corresponds to the data storage capacity of four memory blocks among the plurality of memory blocks BLK in the non-volatile memory 2202.

Referring to FIG. 5, it can be seen that meta data is transmitted to the host 1000 whenever user data is stored in two memory blocks among the memory blocks in the non-volatile memory 2202. In addition, it can be seen that meta data is transmitted to the memory device 2200 whenever user data is stored in four memory blocks among the memory blocks in the non-volatile memory 2202. In FIG. 5, a memory block indicated by slash lines represents a memory block in which user data is stored.

Figure 6:
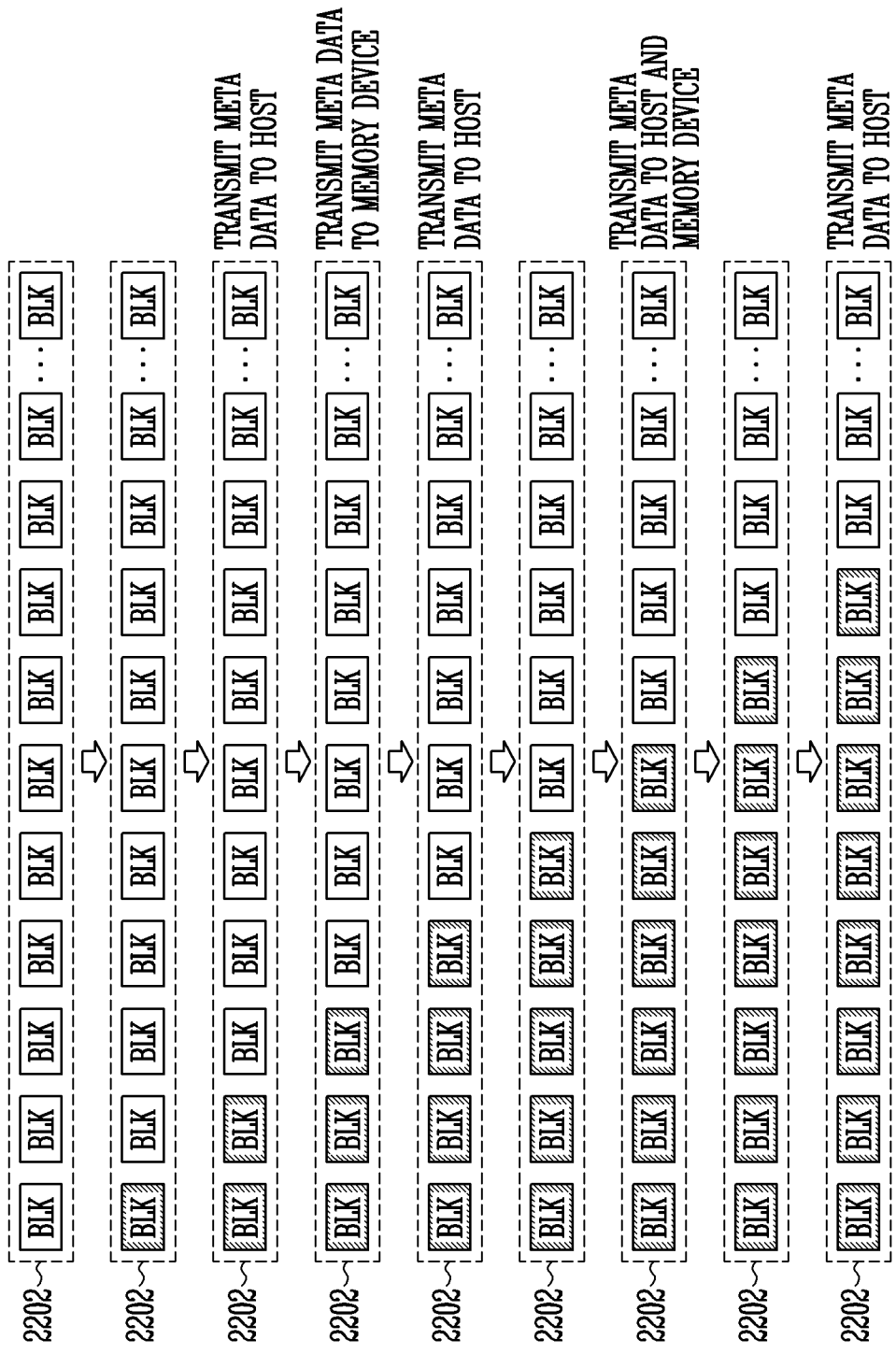
FIG. 6 is a diagram illustrating an example in which a frequency at which meta data is backed up is controlled in accordance with an embodiment of the present disclosure.

FIG. 6 is a diagram illustrating an example in which a frequency at which meta data is backed up is controlled in accordance with an embodiment of the present disclosure.

When the host memory to which meta data is backed up is a volatile memory, it is likely that the meta data backed up to the host memory 1002 will be lost when power of host 1000 is unstable, i.e., occasionally interrupted. Therefore, the memory controller 2100 further increases the frequency at which the meta data is backed up to the memory device 2200, so that the reliability of the memory system 2000 is not deteriorated.

For example, the memory controller 2100 may control the frequency at which meta data is transmitted to the memory device 2200, based on information on power stability of the host 1000. The information on the power stability of the host 1000 may include residual amount of power of a battery of the host 1000, degree of aging of the battery, and/or information indicative of temperature of the host 1000, but the embodiments of the present disclosure are not limited thereto. A decrease in the residual amount of power of the host battery may indicate a decrease in the power stability of the host 1000. Stability of the host 1000 may also decrease as the battery ages, i.e., its degree of aging increases. As the temperature of the host 1000 increases, that may also indicate a decrease in the power stability of the host 1000.

The memory controller 2100 may control increase the frequency at which meta data is transmitted to the memory device 2200 as the power stability of the host 1000 becomes lower. For example, when the power stability of the host 1000 becomes low, the memory controller 2100 may transmit meta data being managed thereby to the memory device 2200 at a third frequency. The third frequency may be higher than the second frequency and lower than the first frequency, but the embodiments of the present disclosure are not limited thereto.

For example, whenever the size of user data provided from the host 1000 to the memory device 2200 is of the first size, the memory controller 2100 may transmit meta data being managed thereby to the host 1000. Whenever the size of user data provided from the host 1000 to the memory device 2200 is of a third size, the memory controller may transmit meta data being managed thereby to the memory device 2200. The third size may be smaller than the second size and greater than the first size, but the embodiments of the present disclosure are limited thereto.

In the embodiment described with reference to FIG. 6, it is assumed that the first size corresponds to the data storage capacity of two memory blocks among the plurality of memory blocks BLK in the non-volatile memory 2202, and the third size corresponds to the data storage capacity of three memory blocks among the memory blocks BLK in the non-volatile memory 2202.

Referring to FIG. 6, it can be seen that meta data is transmitted to the host 1000 whenever user data is stored in two memory blocks among the memory blocks in the non-volatile memory 2202. In addition, it can be seen that meta data is transmitted to the memory device 2200 whenever user data is stored in three memory blocks among the memory blocks in the non-volatile memory 2202. In FIG. 6, a memory block indicated by slash lines represents a memory block in which user data is stored.

Figure 7:
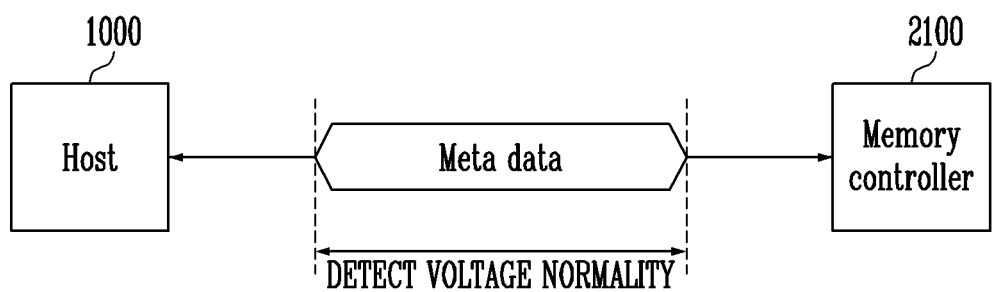
FIG. 7 is a diagram illustrating an example in which voltage abnormality is detected while meta data is being transmitted in accordance with an embodiment of the present disclosure.

FIG. 7 is a diagram illustrating an example in which voltage abnormality is detected while meta data is being transmitted in accordance with an embodiment of the present disclosure.

When voltage abnormality occurs in a voltage supplied to the memory controller 2100 while the memory controller 2100 is transmitting meta data to the host 1000, the meta data may be damaged. Therefore, during power-on after power-off, the reliability of the memory system 2000 may be deteriorated when the memory controller 2100 controls the memory device 2200, based on the damaged meta data received from the host 1000.

Accordingly, the memory controller 210 may check whether voltage abnormality has occurred in a voltage supplied to the memory controller 2100 while the memory controller 2100 is transmitting meta data to the host 1000, and determine whether the meta data is to be retransmitted, based on the result of the check.

For example, when voltage abnormality occurs in a voltage supplied to the memory controller 2100 while the memory controller 2100 is transmitting meta data to the host 1000, the memory controller 2100 may retransmit the meta data to the host 1000. The memory controller 2100 may check whether voltage abnormality has occurred in the voltage supplied to the memory controller 2100 even while the memory controller 2100 is retransmitting the meta data to the host 1000.

When no voltage abnormality occurs in the voltage supplied to the memory controller 2100 while the memory controller 2100 is transmitting (or retransmitting) the meta data to the host 1000, the memory controller 2100 may transmit, to the host 1000, a signal representing that the transmission of the meta data has been completed. Accordingly, the host 1000 may store the meta data received from the memory controller 2100 to the host memory 1002.

Figure 8:
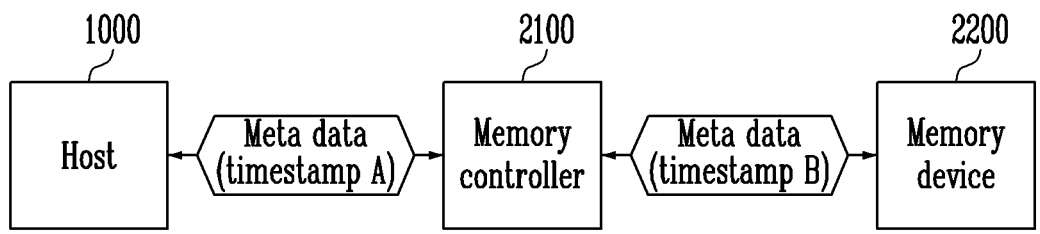
FIG. 8 is a diagram illustrating a timestamp in accordance with an embodiment of the present disclosure.

FIG. 8 is a diagram illustrating a timestamp in accordance with an embodiment of the present disclosure.

The memory controller 2100 may insert a timestamp in meta data whenever the memory controller 2100 transmits the meta data to the host 1000 and the memory device 2200. The timestamp may include a time at which the meta data is generated and/or a time at which the meta data is lastly updated.

During power-on after power-off, the memory controller 2100 may receive meta data stored in the host memory 1002 from the host 1000, and receive meta data stored in the non-volatile memory 2202 from the memory device 2200. The memory controller 2100 may select latest meta data from the two meta data by comparing a timestamp A included in the meta data received from the host 1000 with a timestamp B included in the meta data received from the memory device 2200, and control an operation of the memory device 2200, based on the selected meta data.

Figure 9:
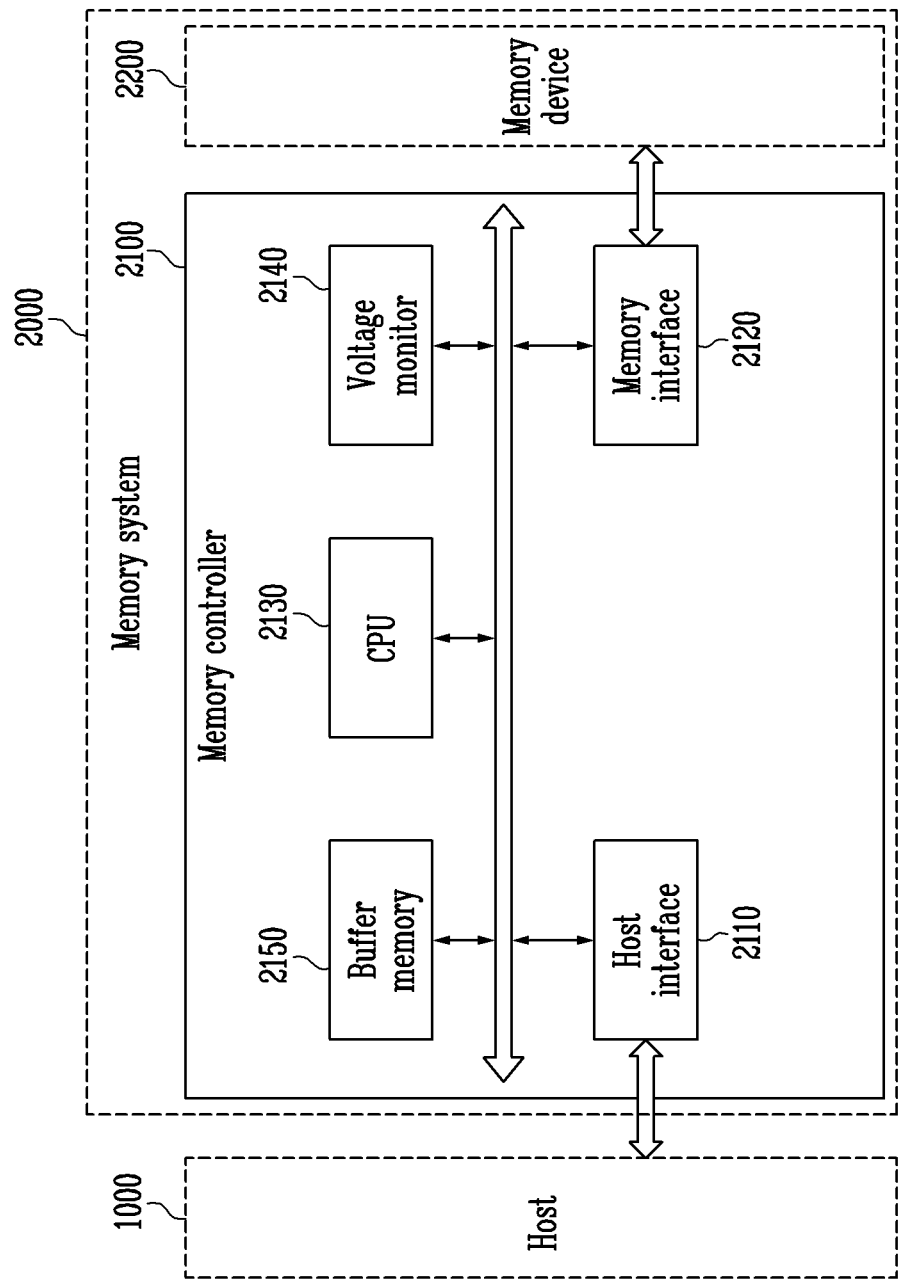
FIG. 9 is a block diagram illustrating a memory controller in accordance with an embodiment of the present disclosure.

FIG. 9 is a diagram illustrating a memory controller in accordance with an embodiment of the present disclosure.

The memory controller 2100 may include a host interface 2110, a memory interface 2120, a central processing unit (CPU) 2130, a voltage monitor 2140, and a buffer memory 2150. The host interface 2110, the memory interface 2120, the voltage monitor 2140, and the buffer memory 2150 may be controlled by the CPU 2130.

The host interface 2110 may perform communication with the host 1000 by using any of various interface protocols. For example, the host interface 2110 may communicate with the host 1000 by using at least one interface protocol among Non-Volatile Memory express (NVMe), Peripheral Component Interconnect-Express (PCI-E), Advanced Technology Attachment (ATA), Serial ATA (SATA), Parallel ATA (PATA), a Universal Serial Bus (USB), a Multi-Media Card (MMC), an Enhanced Small Disk Interface (ESDI), Integrated Drive Electronics (IDE), a Mobile Industry Processor Interface (MIPI), a Universal Flash Storage (UFS), a Small Computer System Interface (SCSI), and/or a Serial Attached SCSI (SAS), but the embodiments of the present disclosure are not limited thereto.

The memory interface 2120 may perform communication with the memory device 2200 by using any of various interface protocols.

The CPU 2130 may perform various calculations to control an operation of the memory device 2200. The CPU 2130 may generate various commands to control an operation of the memory device 2200.

Whenever the CPU 2130 controls an operation of the memory device 2200, the CPU 2130 may generate meta data used to control the operation of the memory device 2200 and store the meta data in the buffer memory 2150, or update the meta data stored in the buffer memory 2150. The meta data may include address mapping information, read count information, open block information, and/or valid page information, but the embodiments of the present disclosure are not limited thereto.

The CPU 2130 may generate a program command when a program request is received from the host 1000. The CPU 2130 may update the address mapping information and/or the valid page information, which are stored in the buffer memory 2150.

For example, when any physical address is not mapped to a logical address received together with the program request from the host 1000, the CPU 2130 may map a physical address to the received logical address. Accordingly, the address mapping information may be updated. The CPU 2130 may transmit the mapped physical address and the program command to the memory device 2200.

For example, when a physical address is mapped to a logical address received together with the program request from the host 1000, the CPU 2130 may process, as invalid data, data stored in a storage area corresponding to the physical address mapped to the received logical address. Accordingly, the valid page information may be updated. Also, the CPU 2130 may map a new physical address to the received logical address. Accordingly, the address mapping information may be updated. The CPU 2130 may transmit the mapped new physical address and the program command to the memory device 2200.

The CPU 2130 may generate a read command when a read request is received from the host 1000. The CPU 2130 may update the read count information stored in the buffer memory 2150.

For example, the CPU 2130 may check a physical address mapped to a logical address together with the read request from the host 1000, with reference to the address mapping information stored in the buffer memory 2150. The CPU 2130 may increase a read count number corresponding to the checked physical address by, for example 1. The CPU 2130 may transmit the checked physical address and the read command to the memory device 2200.

The CPU 2130 may designate, as an open block, at least one memory block among the memory blocks in the memory device 2200, and perform a program operation on the open memory block. The CPU 2130 may designate a new open block when data is fully stored in the memory block presently designated as the open block. The CPU 2130 may update the open block information stored in the buffer memory 2150 whenever a new open block is designated.

The CPU 2130 may insert a timestamp representing a time at which meta data is generated or a time at which meta data is updated in the meta data whenever the meta data is generated or whenever the meta data is updated.

The CPU 2130 may transmit meta data stored in the buffer memory 2150 to at least one of the host 1000 and the memory device 2200 at certain times, e.g., periodically.

The CPU 2130 may transmit the meta data stored in the buffer memory 2150 to the host 1000 at a first frequency, and transmit the meta data stored in the buffer memory 2150 to the memory device 2200 at a second frequency. The second frequency may be lower than the first frequency.

For example, in a program operation for programming user data received from the host 1000 in the memory device 2200, the CPU 2130 may check a size of the user data transmitted to the memory device 2200. Whenever the user data provided from the host 1000 to the memory device 2200 is the first size, the CPU 2130 may transmit the meta data stored in the buffer memory 2150 to the host 1000. Whenever user data provided from the host 1000 to the memory device 2200 is the second size, the CPU 2130 may transmit the meta data stored in the buffer memory 2150 to the memory device 2200. The second size may be greater than the first size.

The CPU 2130 may control the second frequency, based on information on power stability of the host 1000. For example, the CPU 2130 may receive information on power stability from the host 1000. For example, the information on power stability may be periodically received, or be received according to a request of the CPU 1230. For example, the information on power stability may include residual amount of power of a battery of the host 1000, degree of aging of the battery, and temperature of the host 1000 (or information indicative thereof).

The CPU 2130 may increase the second frequency as the power stability becomes lower. The CPU 2130 may decrease the second frequency as the power stability becomes higher.

The CPU 2130 may retransmit the meta data stored in the buffer memory 2150 to the host 1000 or transmit, to the host 1000, a signal representing that the transmission of the meta data has been completed, according to whether voltage abnormality has occurred in a voltage supplied to the memory controller 2100 while the meta data is being transmitted to the host 1000. Information on whether voltage abnormality has occurred in the voltage supplied to the memory controller 2100 may be received from the voltage monitor 2140.

The voltage monitor 2140 may monitor the voltage supplied to the memory controller 2100, and determine whether voltage abnormality has been occurred. For example, the voltage monitor 2140 may determine that voltage abnormality has occurred, when the voltage supplied to the memory controller 2100 falls below a first threshold value or when the voltage supplied to the memory controller 2100 increases to a second threshold value or more, which is greater than the first threshold value. That is, voltage abnormality may be determined to have occurred whenever the voltage supplied to the memory controller 2100 is outside of a defined range. The voltage monitor 2140 may provide the result of the voltage abnormality determination to the CPU 2130.

During power-on after power-off, the CPU 2130 may compare meta data received from the host 1000 with meta data received from the memory device 2200, and select latest meta data from the two meta data. The latest meta data may be selected with reference to a timestamp included in the meta data. The CPU 2130 may load the selected meta data to the buffer memory 2150, and control an operation of the memory device 2200, based on the loaded meta data.

The buffer memory 2150 may temporarily store data while the memory controller 2100 is controlling the operation of the memory device 2200. For example, the buffer memory 2150 may store user data and/or meta data. The buffer memory 2150 may be the volatile memory 2102 described with reference to FIG. 4.

Figure 10:
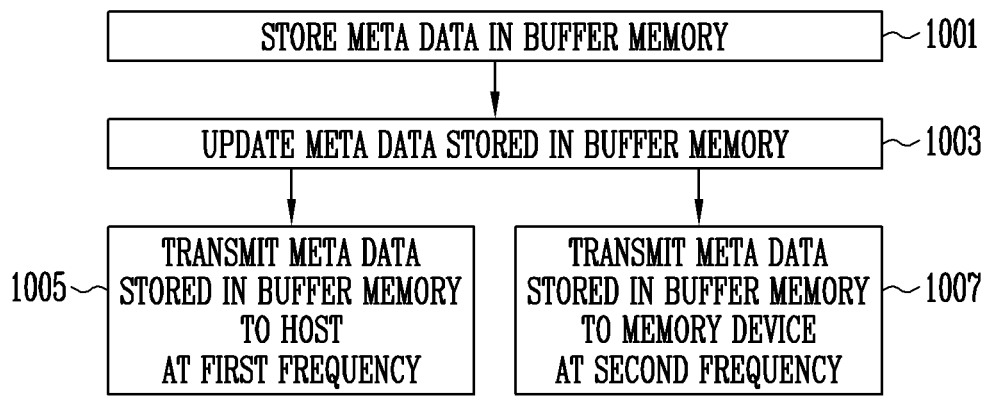
FIG. 10 is a flowchart illustrating an operating method of the memory controller in accordance with an embodiment of the present disclosure.

FIG. 10 is a flowchart illustrating an operating method of the memory controller in accordance with an embodiment of the present disclosure.

In step 1001, the memory controller 2100 may generate meta data to control an operation of the memory device 2200, and store the generated meta data in the buffer memory 2150. The memory controller 2100 may insert a timestamp representing a time at which the meta data is generated in the meta data.

In step 1003, the memory controller 2100 may update the meta data stored in the buffer memory 2150. For example, the memory controller 2100 may update address mapping information, valid page information, and/or open block information in a program operation. For example, the memory controller 2100 may update read count information in a read operation. The memory controller 2100 may insert in the meta data a timestamp representing a time at which the meta data is updated.

In step 1005, the memory controller 2100 may transmit the meta data stored in the buffer memory 2150 to the host 1000 at a first frequency. For example, the memory controller 2100 may transmit the meta data stored in the buffer memory 2150 to the host 1000 whenever user data provided from the host 1000 to the memory device 2200 is the first size.

In step 1007, the memory controller 2100 may transmit the meta data stored in the buffer memory 2150 to the memory device 2200 at a second frequency lower than the first frequency. For example, the memory controller 2100 may transmit the meta data stored in the buffer memory 2150 to the memory device 2200 whenever user data provided from the host 1000 to the memory device 2200 is the second size.

Figure 11:
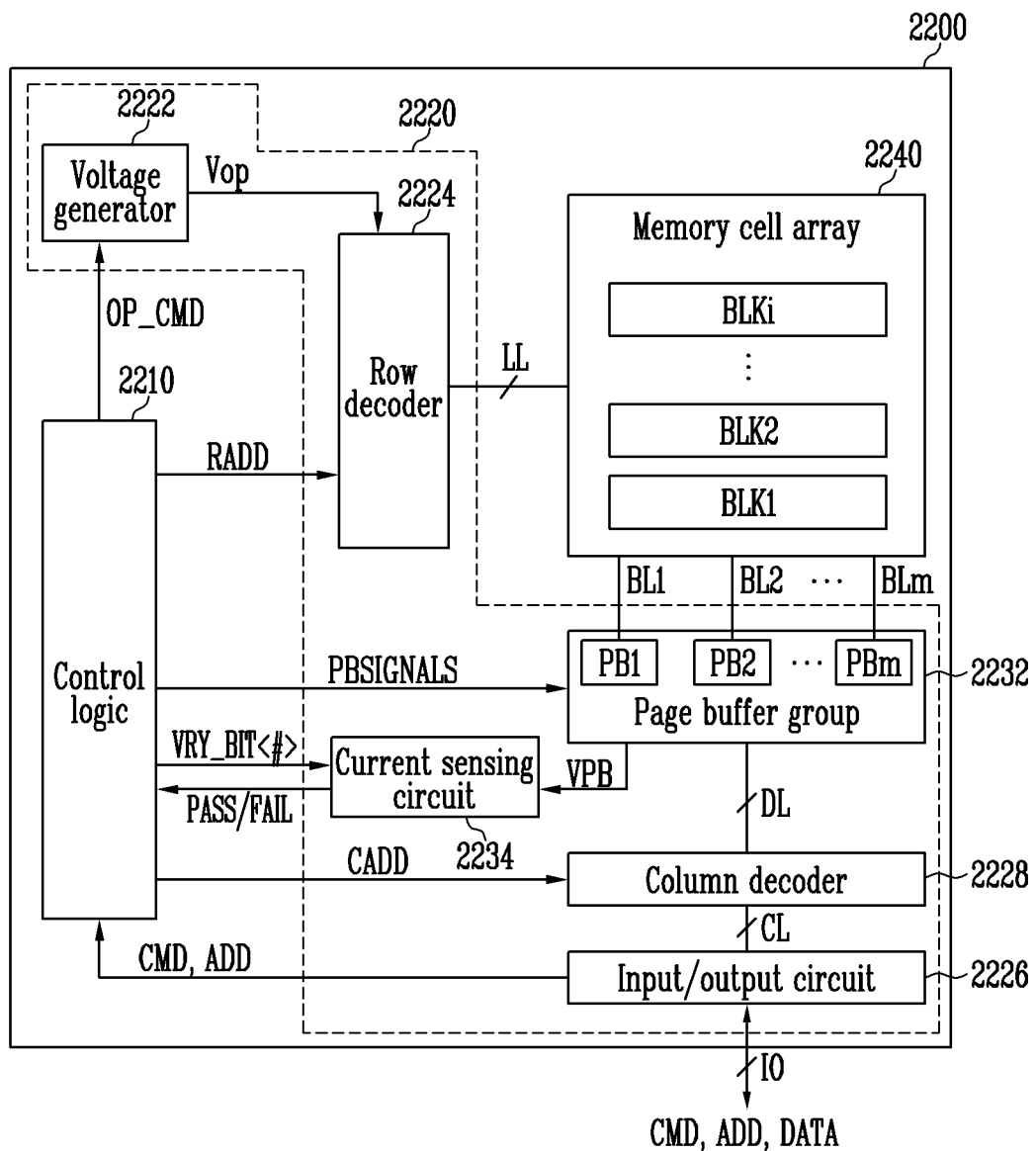
FIG. 11 is a diagram illustrating a memory device, such as those shown in FIGS. 4 and 9.

FIG. 11 is a diagram illustrating the memory device shown in FIGS. 4 and 9.

The memory device 2200 may include control logic 2210, peripheral circuits 2220, and a memory cell array 2240.

The control logic 2210 may control the peripheral circuit 2220 under the control of the memory controller 2100.

The control logic 2210 may control the peripheral circuit 2200 in response to a command CMD and an address ADD, which are received from the memory controller, through an input/output circuit 2226. For example, the control logic 2210 may output an operation signal OP_CMD, a row address RADD, a column address CADD, page buffer control signals PBSIGNALS, and an allow bit VRY_BIT<#> in response to the command CMD and the address ADD. The control logic 2210 may determine whether a verify operation has passed or failed in response to a pass signal PASS or a fail signal FAIL, which is received from a current sensing circuit 2234.

The peripheral circuit 2200 may perform a program operation for storing data in the memory cell array 2240, a read operation for outputting data stored in the memory cell array 2240, and an erase operation for erasing data stored in the memory cell array 2240.

The peripheral circuit 2220 may include a voltage generator 2222, a row decoder 2224, the input/output circuit 2226, a column decoder 2228, a page buffer group 2232, and the current sensing circuit 2234.

The voltage generator 2222 may generate various operating voltages Vop used in program, read, and erase operations in response to an operation signal OP_CMD received from the control logic 2210. For example, the voltage generator 2222 may transfer, to the row decoder 2224, a program voltage, a verify voltage, a pass voltage, a read voltage, an erase voltage, a turn-on voltage, and the like.

The row decoder 2224 may transfer operating voltages Vop to local lines LL coupled to a selected memory block among memory blocks included in the memory cell array 2240, in response to a row address RADD received from the control logic 2210. The local lines LL may include local word lines, local drain lines, etc. Besides, the local lines LL may include various lines coupled to the memory block, such as a source line.

The input/output circuit 2226 may transfer a command CMD and an address ADD, which are received from the memory controller through input/output lines JO, to the control logic 2210, or exchange data DATA with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL, or exchange data with the input/output circuit 2226 through column lines CL.

The page buffer group 2232 may be coupled to bit lines BL1 to BLm commonly coupled to memory blocks BLK1 to BLKi. The page buffer group 2232 may include a plurality of page buffers PB1 to PBm coupled to the bit lines BL1 to BLm. For example, one page buffer may be coupled for each bit line. The page buffers PB1 to PBm may operate in response to page buffer control signals PBSIGNALS received from the control logic 2210. For example, the page buffers PB1 to PBm may temporarily store program data received from the memory controller in a program operation, and adjust a voltage applied to the bit lines BL1 to BLm according to the program data. Also, the page buffers PB1 to PBm may temporarily store data received through the bit lines BL1 to BLm in a read operation, or sense voltages or currents of the bit lines BL1 to BLm.

The current sensing circuit 2234 may generate a reference current in response to an allow bit VRY_BIT<#>, and output a pass signal PASS or a fail signal FAIL by comparing a reference voltage generated by the reference current with a sensing voltage VPB received from the page buffer group 2232.

The memory cell array 2240 may include a plurality of memory blocks BLK1 to BLKi in which data is stored. User data and various information for an operation of the memory device 2200 may be stored in the memory blocks BLK1 to BLKi. The memory blocks BLK1 to BLKi may be implemented in a two-dimensional structure or three-dimensional structure, and each memory block may be configured identically.

Figure 12:
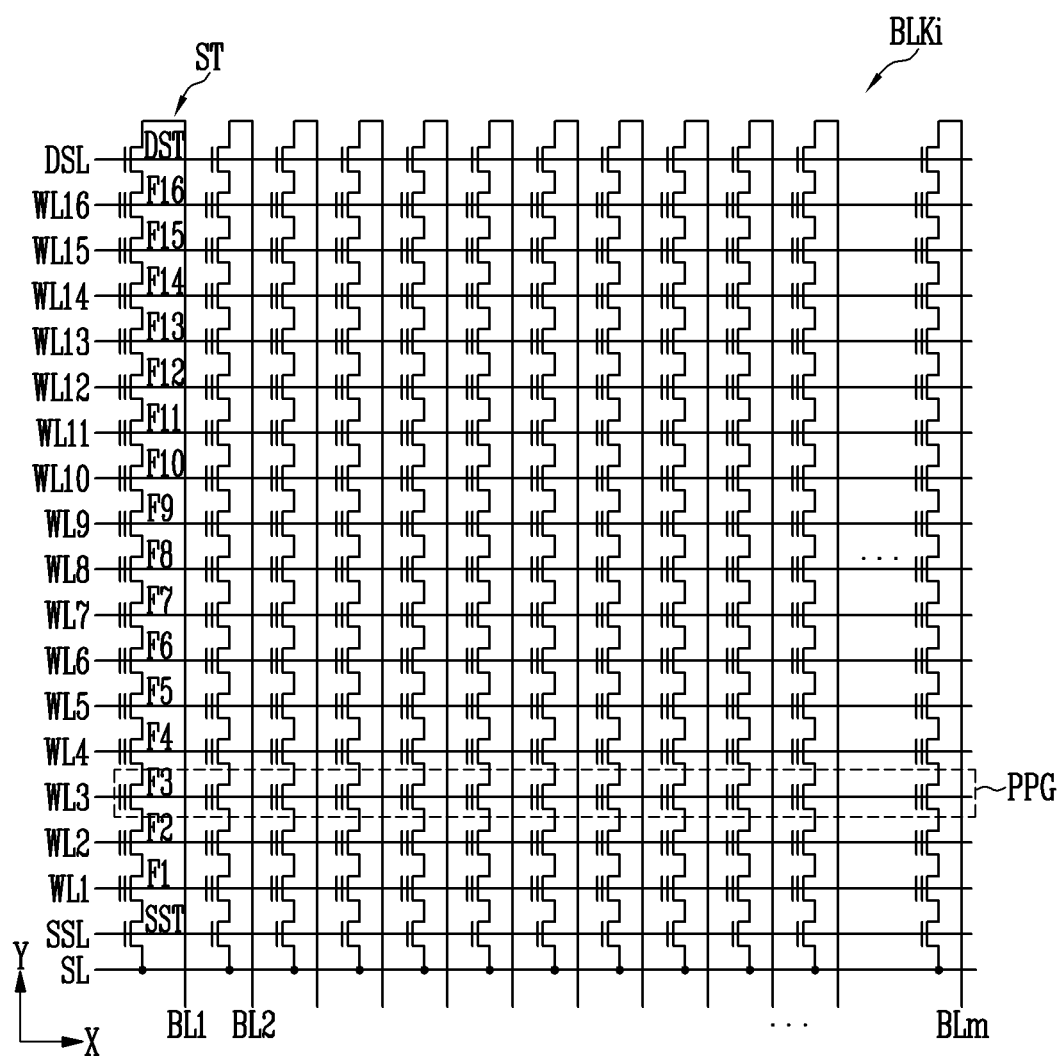
FIG. 12 is a diagram illustrating an exemplary memory block.

FIG. 12 is a diagram illustrating an exemplary memory block.

The memory cell array 2240 may include a plurality of memory blocks. A representative memory block BLKi of the memory blocks BLK1 to BLKi shown in FIG. 11 is illustrated in FIG. 12.

In the memory block BLKi, a plurality of word lines arranged in parallel to one another may be coupled between a first select line and a second select line. The first select line may be a source select line SSL, and the second select line may be a drain select line DSL. Specifically, the memory block BLKi may include a plurality of strings ST coupled between bit lines BL1 to BLm and a source line SL. The bit lines BL1 to BLm may be coupled to the strings ST, respectively, and the source line SL may be commonly coupled to the strings ST. The strings ST may be configured identically to one another, and therefore, a string ST coupled to a first bit line BL1 is described in detail as an example.

The string ST may include a source select transistor SST, a plurality of memory cells F1 to F16, and a drain select transistor DST, which are coupled in series between the source line SL and the first bit line BL1. At least one source select transistor SST and at least one drain select transistor DST may be included in one string ST, and more than the 16 memory cells F1 to F16 shown in the drawing may be included in the one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SSTs included in different strings STs may be coupled to the source select line SSL, gates of drain select transistors DSTs included in different strings STs may be coupled to the drain select line DSL, and gates of the memory cells F1 to F16 included in different strings STs may be coupled to the plurality of word lines WL1 to WL16. A group of memory cells coupled to the same word line among the memory cells included in different strings STs may be referred as a physical page PPG. Therefore, physical pages PPG of which number corresponds to that of the word lines WL1 to WL16 may be included in the memory block BLKi.

Figure 13:
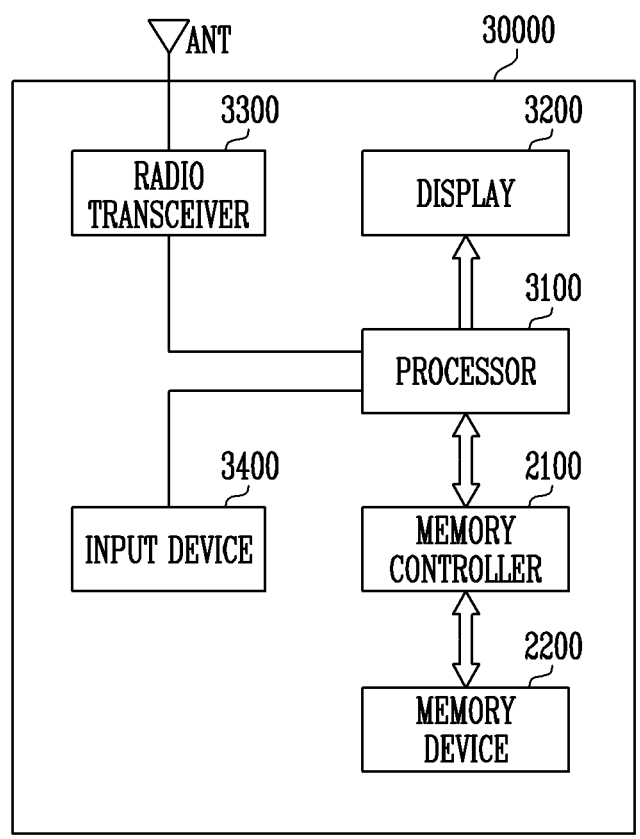
FIG. 13 is a diagram illustrating another example of a memory system including a memory controller, such as those shown in FIGS. 4 and 9.

FIG. 13 is a diagram illustrating another example of the memory system including the memory controller shown in FIGS. 4 and 9.

Referring to FIG. 13, the memory system 30000 may be implemented as a cellular phone, a smart phone, a tablet PC, a personal digital assistant (PDA), or a wireless communication device. The memory system 30000 may include a memory device 2200 and a memory controller 2100 capable of controlling an operation of the memory device 2200.

The memory controller 2100 may control a data access operation of the memory device 2200, e.g., a program operation, an erase operation, a read operation, or the like under the control of a processor 3100.

Data programmed in the memory device 2200 may be output through a display 3200 under the control of the memory controller 2100.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may convert a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

Figure 14:
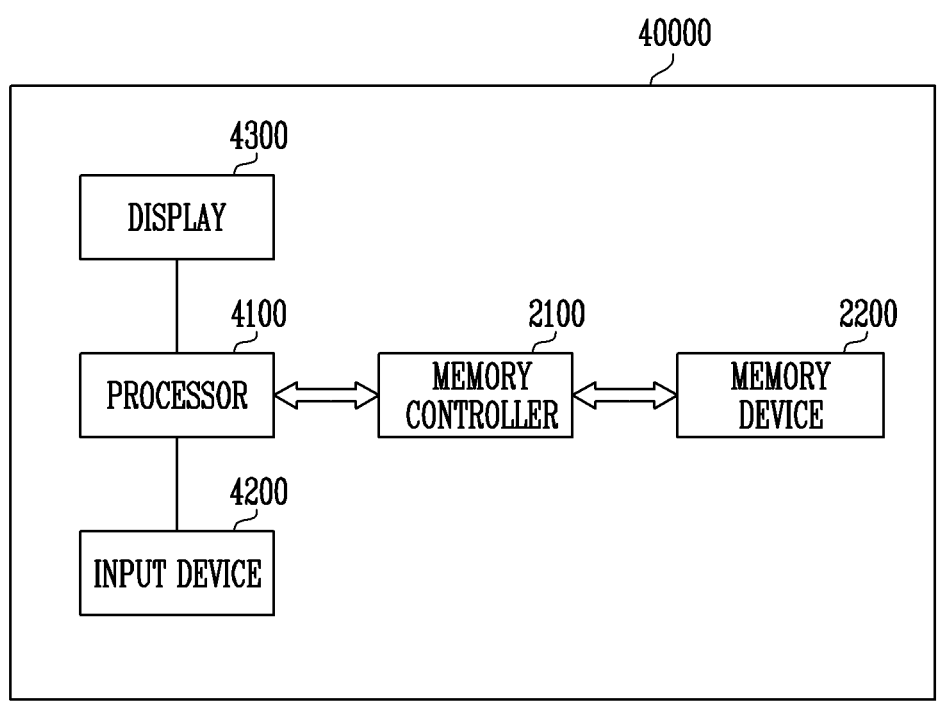
FIG. 14 is a diagram illustrating another example of a memory system including a memory controller, such as those shown in FIGS. 4 and 9.

FIG. 14 is a diagram illustrating another example of the memory system including the memory controller shown in FIGS. 4 and 9.

Referring to FIG. 14, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 2200 and a memory controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operation of the memory system 40000, and control an operation of the memory controller 2100. In some embodiments, the memory controller 2100 capable of controlling an operation of the memory device 2200 may be implemented as a part of the processor 4100, or be implemented as a chip separate from the processor 4100.

Figure 15:
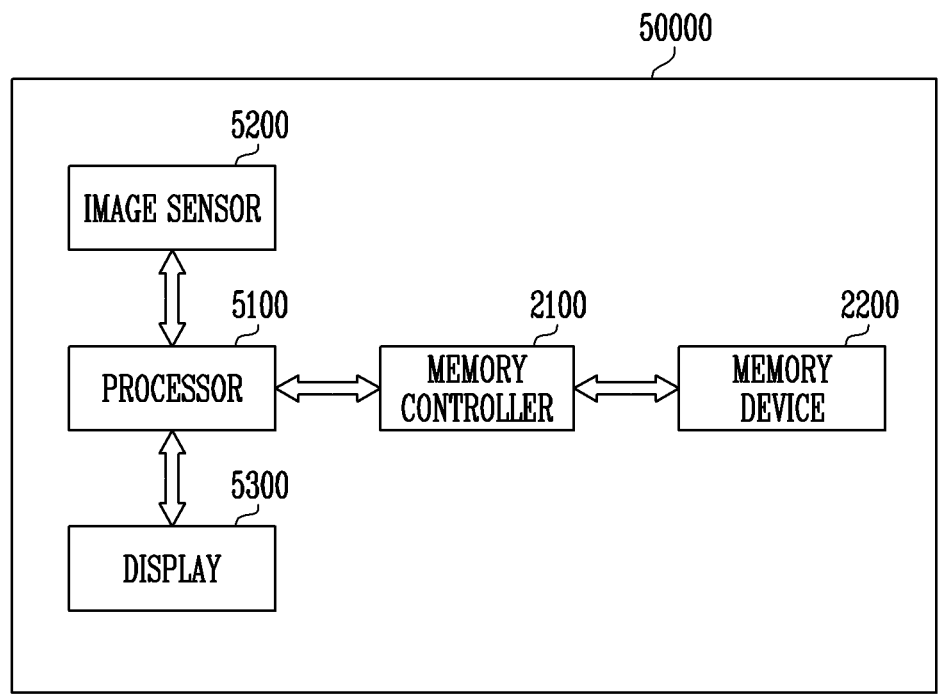
FIG. 15 is a diagram illustrating another example of a memory system including a memory controller, such as those shown in FIGS. 4 and 9.

FIG. 15 is a diagram illustrating another example of the memory system including the memory controller shown in FIGS. 4 and 9.

Referring to FIG. 15, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 2200 and a memory controller 2100 capable of controlling a data processing operation of the memory device 2200, e.g., a program operation, an erase operation, or a read operation.

An image sensor 5200 of the memory system 50000 may convert an optical image into digital signals, which may be transmitted to a processor 5100 or the memory controller 2100. Under the control of the processor 5100, the converted digital signals may be output through a display 5300, or be stored in the memory device 2200 through the memory controller 2100. In addition, data stored in the memory device 2200 may be output through the display 5300 under the control of the processor 5100 or the memory controller 2100.

In some embodiments, the memory controller 2100 capable of controlling an operation of the memory device 2200 may be implemented as a part of the processor 5100, or be implemented as a chip separate from the processor 5100.

Figure 16:
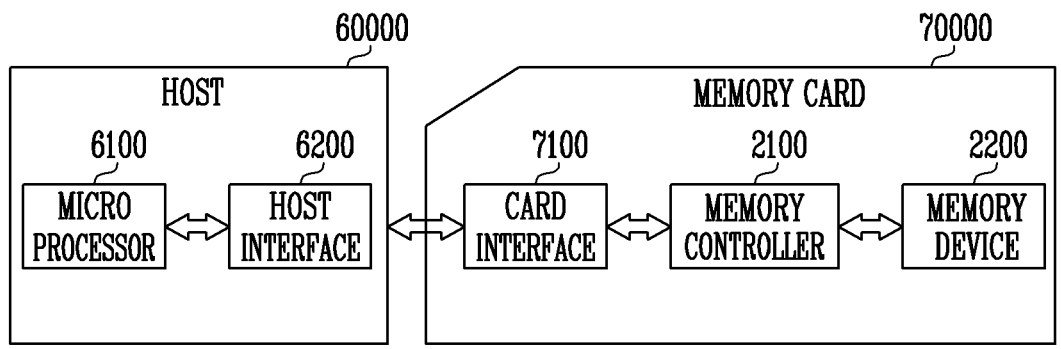
FIG. 16 is a diagram illustrating another example of a memory system including a memory controller, such as those shown in FIGS. 4 and 9.

FIG. 16 is a diagram illustrating another example of the memory system including the memory controller shown in FIGS. 4 and 9.

Referring to FIG. 16, the memory card 70000 may be implemented as a memory card or a smart card. The memory card 70000 may include a memory device 2200, a memory controller 2100, and a card interface 7100.

The memory controller 2100 may control data exchange between the memory device 2200 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 2100 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory card 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor 6100.

In accordance with embodiments of the present disclosure, loss of meta data managed by the memory controller can be reduced, and thus the reliability of the memory system can be improved.

While embodiments of the present disclosure has been shown and described with reference to certain embodiments thereof, it will be understood by those skilled in the art that various changes in form and details may be made therein without departing from the spirit and scope of the present invention as defined by the appended claims and their equivalents. Therefore, the scope of the present disclosure should not be limited by or to any of the above-described embodiments but should be determined by the appended claims and equivalents thereof.

In the above-described embodiments, one or more steps may be selectively performed or part of step(s) may be omitted. The steps need not necessarily be performed in accordance with the described order in all embodiments; in some cases, the order of the steps may be rearranged. The embodiments disclosed herein are only examples to facilitate an understanding of the present invention, not to limit it. That is, it should be apparent to those skilled in the art that various modifications can be made on the basis of the technological scope of the present disclosure.

Although specific terminologies are used herein, they are used only to explain embodiments of the present disclosure. Therefore, the present invention is not limited by any specific terminology; rather, many variations are possible within the spirit and scope of the present invention. The present invention encompasses all such variations that fall within the scope of the claims.

What is claimed is:

1. A memory controller comprising:
   a buffer memory configured to store meta data used to control an operation of a memory device;
   a central processing unit configured to:
   update the meta data stored in the buffer memory based on whether the operation of the memory device is controlled,
   transmit the meta data stored in the buffer memory to a host at a first frequency, and
   transmit the meta data stored in the buffer memory to the memory device at a second frequency lower than the first frequency; and
   a voltage monitor configured to determine whether voltage abnormality has occurred in a voltage supplied to the memory controller while the meta data stored in the buffer memory is being transmitted to the host.

2. The memory controller of claim 1, wherein the central processing unit controls the second frequency based on information on power stability of the host.

3. The memory controller of claim 2, wherein the central processing unit increases the second frequency as the power stability becomes lower.

4. The memory controller of claim 2, wherein information on the power stability includes at least one of residual amount of power of a battery of the host, degree of aging of the battery, or temperature of the host.

5. The memory controller of claim 1, wherein the central processing unit transmits the meta data stored in the buffer memory to the host whenever user data provided from the host to the memory device is a first size, and transmits the meta data stored in the buffer memory to the memory device whenever user data is a second size greater than the first size.

6. The memory controller of claim 1, wherein the central processing unit transmits, to the host, a signal representing that the transmission of the meta data stored in the buffer memory has been completed after the meta data is transmitted to the host, according to determination of the voltage monitor that voltage abnormality has not occurred.

7. The memory controller of claim 1, wherein the central processing unit retransmits the meta data stored in the buffer memory to the host, according to determination of the voltage monitor that voltage abnormality has occurred.

8. The memory controller of claim 1, wherein, during power-on after power-off, the central processing unit selects latest meta data from meta data received from the host and meta data received from the memory device, and controls the operation of the memory device, based on the selected meta data.

9. The memory controller of claim 1, wherein the meta data includes at least one of address mapping information, read count information, open block information, or valid page information.

10. A method for operating a memory controller, the method comprising:
    updating meta data stored in a buffer memory based on whether an operation of a memory device is controlled;
    transmitting the meta data stored in the buffer memory to a host at a first frequency;
    transmitting the meta data stored in the buffer memory to the memory device at a second frequency lower than the first frequency; and
    determining whether voltage abnormality has occurred in a voltage supplied to the memory controller while the meta data stored in the buffer memory is being transmitted to the host.

11. The method of claim 10, further comprising controlling the second frequency based on information on power stability of the host.

12. The method of claim 11, wherein the controlling of the second frequency includes increasing the second frequency as the power stability becomes lower.

13. The method of claim 11, wherein the information on the power stability includes at least one of residual amount of power of a battery of the host, degree of aging of the battery, or temperature of the host.

14. The method of claim 10,
    wherein the transmitting of the meta data to the host at the first frequency includes transmitting the meta data stored in the buffer memory to the host whenever user data provided from the host to the memory device is a first size,
    wherein the transmitting of the meta data to the memory device at the second frequency includes transmitting the meta data stored in the buffer memory to the memory device whenever user data is a second size greater than the first size.

15. The method of claim 10, further comprising transmitting, to the host, a signal representing that the transmission of the meta data stored in the buffer memory has been completed after the meta data is transmitted to the host, according to determination that voltage abnormality has not occurred.

16. The method of claim 10, further comprising retransmitting the meta data stored in the buffer memory to the host, according to determination that voltage abnormality has occurred.

17. The method of claim 10, further comprising:
    selecting latest meta data from meta data received from the host and meta data received from the memory device, during power-on after power-off; and
    controlling the operation of the memory device based on the selected meta data.

18. The method of claim 10, wherein the meta data includes at least one of address mapping information, read count information, open block information, or valid page information.

* * * * *